# United States Patent
Langhammer (10) Patent No.: US 10,230,399 B2
(45) Date of Patent: Mar. 12, 2019

(54) CIRCUITRY AND METHOD FOR DECOMPOSABLE DECODER

(71) Applicant: Altera Corporation, San Jose, CA (US)

(72) Inventor: Martin Langhammer, Salisbury (GB)

(73) Assignee: Altera Corporation, San Jose, CA (US)

( * ) Notice: Subject to any disclaimer, the term of this patent is extended or adjusted under 35 U.S.C. 154(b) by 99 days.

(21) Appl. No.: 14/986,788

(22) Filed: Jan. 4, 2016

(65) Prior Publication Data

US 2016/0373134 A1 Dec. 22, 2016

Related U.S. Application Data

(60) Provisional application No. 62/181,470, filed on Jun. 18, 2015.

(51) Int. Cl.
*H03M 13/00* (2006.01)
*H03M 13/15* (2006.01)

(52) U.S. Cl.
CPC ... *H03M 13/1575* (2013.01); *H03M 13/1525* (2013.01); *H03M 13/1595* (2013.01); *H03M 13/6508* (2013.01); *H03M 13/6572* (2013.01)

(58) Field of Classification Search
CPC ....... G06F 11/10; H03M 13/00; H03M 13/15; H03M 13/1523; H03M 13/1525; H03M 13/1575; H03M 13/1595; H03M 13/6508; H03M 13/6572

See application file for complete search history.

(56) References Cited

U.S. PATENT DOCUMENTS

| | | | | |
|---|---|---|---|---|
| 4,845,713 A * | 7/1989 | Zook | ...................... | H03M 13/15 714/784 |
| 5,910,960 A * | 6/1999 | Claydon | .................. | H03K 5/24 348/E5.108 |
| 6,470,471 B1 * | 10/2002 | Noguchi | ........... | H03M 13/1515 714/782 |
| 2003/0101406 A1 * | 5/2003 | Song | ...................... | H03M 13/00 714/774 |
| 2003/0106014 A1 * | 6/2003 | Dohmen | ........... | H03M 13/1535 714/785 |

(Continued)

*Primary Examiner* — Albert Decady
*Assistant Examiner* — Enamul M Kabir
(74) *Attorney, Agent, or Firm* — Fletcher Yoder, P.C.

(57) ABSTRACT

Decoder circuitry for an input channel having a data rate, where a codeword on the input channel includes a plurality of symbols, includes options to provide a first output channel having that data rate, and a plurality of second output channels having slower data rates. The decoder circuitry includes syndrome calculation circuitry, polynomial calculation circuitry, and search-and-correct circuitry. The syndrome calculation circuitry includes finite-field multipliers for multiplying each symbol by a power of a root of the field. Each multiplier other than a first multiplier multiplies a symbol by a higher power of the root than an adjacent multiplier. First-level adders add outputs of a number of groups of multipliers. A second-level adder adds outputs of the first-level adders to be accumulated as syndromes of the first output channel. Another plurality of accumulators accumulates outputs of the first-level adders, which after scaling, are syndromes of the second output channels.

21 Claims, 11 Drawing Sheets

(56) References Cited

U.S. PATENT DOCUMENTS

2007/0300137 A1* 12/2007 Lakshminarayana ........................ H03M 13/1515
714/784

* cited by examiner

CIRCUITRY AND METHOD FOR DECOMPOSABLE DECODER

CROSS REFERENCE TO RELATED APPLICATION

This patent document claims the benefit of commonly-assigned U.S. Provisional Patent Application No. 62/181,470, filed Jun. 18, 2015, which is hereby incorporated by reference herein in its entirety.

FIELD OF THE INVENTION

This invention relates to breaking down a forward-error-correcting (FEC) decoder into multiple slower forward-error-correcting decoders.

BACKGROUND OF THE INVENTION

In certain applications of FEC decoders including BCH-type decoders such as, e.g., Reed-Solomon decoders, decoders of different size or throughput may be required. These decoders may have different numbers of check, or parity, symbols for each codeword. Heretofore, different decoder "engines" or circuits have been needed for each different-sized decoder.

SUMMARY OF THE INVENTION

In accordance with embodiments of the present invention, a faster FEC decoder, such as a Reed-Solomon or other BCH-type decoder, can be decomposed into multiple slower FEC decoders. For example, a system may require multiple different FEC decoders, such as a system that receives data at one rate but handles data internally at a different, slower rate. In this example, the system can have a faster FEC decoder for its external interface, and slower FEC decoders internally, while using a common decoder engine for all of the FEC decoders, with the faster FEC decoder being decomposed into parallel slower FEC decoders using that common decoder engine.

The number of check, or parity, symbols supported for each codeword may be different as between the larger (i.e., faster) and smaller (i.e., slower) FEC decoders. The number of check symbols, and therefore the number of syndromes to be calculated, also can differ. Although normally one would expect the codeword of a larger FEC decoder to have a larger number of check symbols than the codeword of a smaller FEC decoder, the reverse also is possible.

The invention provides an architecture that can be used for any combination of larger and smaller FEC decoders with different-sized codewords and different numbers of check symbols per codeword, as well as codewords whose boundaries may not coincide with clock boundaries. Although the architecture is flexible, for any combination of decoder sizes, any particular implementation of the architecture will be fixed, and should contain resources for the maximum number of check symbols to be supported by that implementation.

It should be noted that this invention is best suited to implementations in which the field size (the number of bits in the Galois field) and the irreducible polynomial (which defines the field sequence) are the same for all decoder decompositions. While implementations of this invention also could be used in cases where the field definition is variable between the decoder types, in such implementations, the larger amount of resources required may result in a decoder that is larger than would result from simply implementing separate decoders for the different cases.

The different decoder implementations will depend on the circumstances. In one example, a 400 Gbps Ethernet channel may be connected to equipment that does not support more than 100 Gbps. A solution would be to decompose the 400 Gbps channel into four 100 Gbps channels. However, implementations of the invention are scalable. Therefore, a 400 Gbps channel also could be decomposed into 8 50 Gbps channels or 16 25 Gbps channels. In a 400 gigabit Ethernet scenario, in which the 400 Gbps channel is provided as two parallel 200 Gbps channels, a two-to-one decomposition will yield two 100 Gbps channels from each of the 200 Gbps channels.

Therefore, in accordance with embodiments of the present invention there is provided decoder circuitry for an input channel having a first data rate, where a codeword on the input channel includes a plurality of symbols in parallel. The decoder channel includes both an option to provide a first output channel having the first data rate and an option to provide a plurality of second output channels having data rates less than the first data rate. The decoder circuitry includes syndrome calculation circuitry, polynomial calculation circuitry, and search-and-correct circuitry. The syndrome calculation circuitry includes plurality of finite-field multipliers corresponding in number to the plurality of symbols, for multiplying the symbols by a power of a root of said finite field, each respective multiplier in the plurality of multipliers, other than a first multiplier, multiplying a respective symbol in said plurality of symbols by a higher power of said root than an adjacent multiplier in said plurality of multipliers. First-level adder circuitry adds outputs of a number of groups of multipliers in the plurality of multipliers. A second-level adder adds outputs of the first-level adder circuitry. A first accumulator accumulates outputs of the second-level adder as syndromes of the first output channel. A plurality of second accumulators equal in number to the groups of multipliers accumulates outputs of the first-level adder circuitry. A respective scaling multiplier operates on all but one of the second accumulators. An output of each of the second accumulators is a syndrome of one of the second output channels.

A method of operating such circuitry also is provided.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which.

DETAILED DESCRIPTION OF THE INVENTION

As noted above, this disclosure describes an architecture according to which a faster FEC decoder, such as a BCH decoder, and particularly a Reed-Solomon decoder, can be decomposed into multiple slower FEC decoders. For example, a system may require multiple different FEC decoders, such as a system that receives data at one rate but handles data internally at a different, slower rate. In this example, the system can have a faster FEC decoder for its external interface, and slower FEC decoders internally. With the faster FEC decoder decomposed into parallel slower FEC decoders, both the faster external decoder and the slower internal decoders can be constructed using a common, slower, decoder engine.

Figure 1:
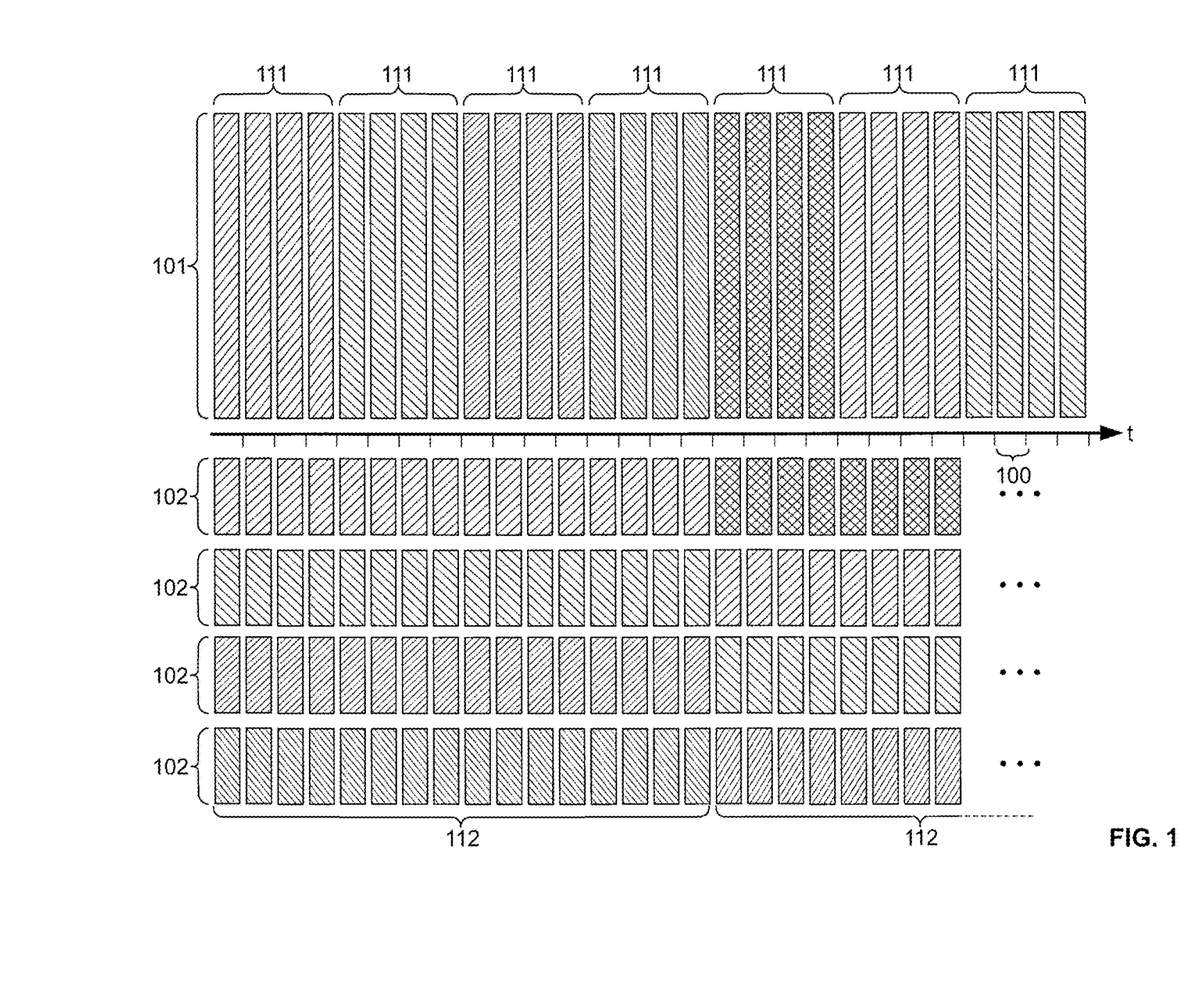
FIG. 1 shows typical codeword input patterns for a first channel and four slower channels where codeword boundaries coincide with clock cycle boundaries.

FIG. 1 shows an example of the decomposition between a faster channel 101 in the top half of the drawing, and four slower parallel channels 102 in the lower half of the drawing. For simplicity, the codewords are identical (e.g., RS(544,528)). However, it also is possible for the codeword in the faster channel 101 to have one specification (e.g., RS(544,514)) and the codeword in the slower channels 102 to have a different specification (e.g., RS(528,514)).

As can be seen, each single codeword 111 in the faster channel 101 is input over four clocks 100 (e.g., 136 symbols per clock). The codewords 112 in the parallel slower channels 102, are input over 16 clocks 100 (e.g., 34 symbols per clock). The codeword boundaries coincide with clock boundaries. It can be seen that the lower speed configuration will have a longer input latency than the higher throughput case, even though the aggregate throughput is identical.

Figure 2:
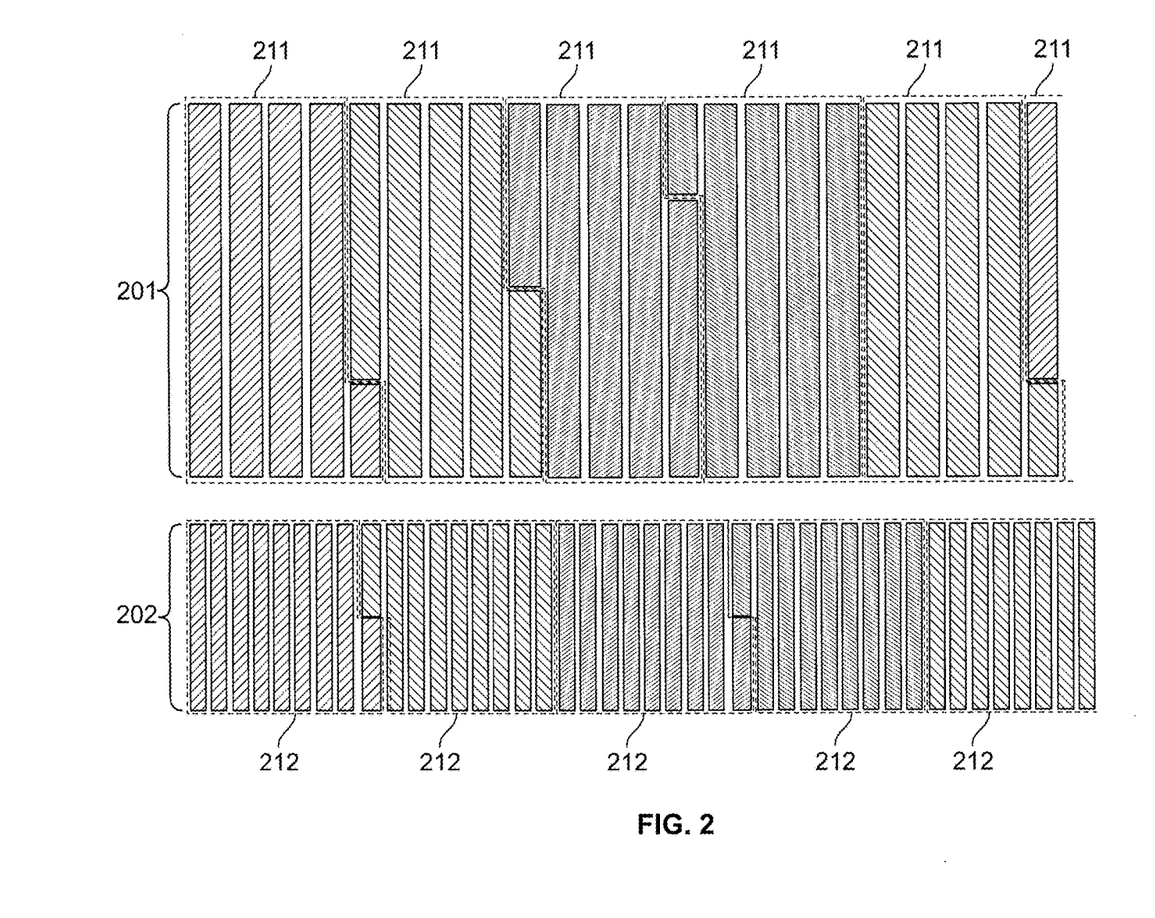
FIG. 2 shows a comparison of codeword input patterns for first channels of different speeds where codeword boundaries do not coincide with clock cycle boundaries.

FIG. 2 shows only the input lanes for more complex cases in which the codeword length is not evenly divisible by the number of symbols input per clock, and so the start and end points of the codewords varies relative to the clock boundaries. For example, the lane 201 in the upper portion of the drawing could correspond to an RS(544,514) codeword 211 being input 128 symbols at a time, and the lane 202 in the lower portion of the drawing could show the same codeword 212 being input 64 symbols at a time at a faster clock rate. The slower and faster clock rates may correspond, for example, to different circuit implementations, such as a field-programmable gate array (FPGA) implementation and an application-specific integrated circuit (ASIC) implementation, respectively. Either way, the decomposed slower channels are not shown in this drawing.

One implementation for dealing with codeword lengths that do not correspond to clock boundaries is shown in copending, commonly-assigned U.S. patent application Ser. No. 14/844,551, filed Sep. 3, 2015, which is hereby incorporated by reference herein in its entirety. After applying techniques, such as those disclosed in that copending application, to the inputs shown in FIG. 2, those may be processed as disclosed in the remainder of this disclosure. In particular, the handling of multiple codewords, all with potentially different end/start positions, is detailed in the discussion below.

Figure 3:
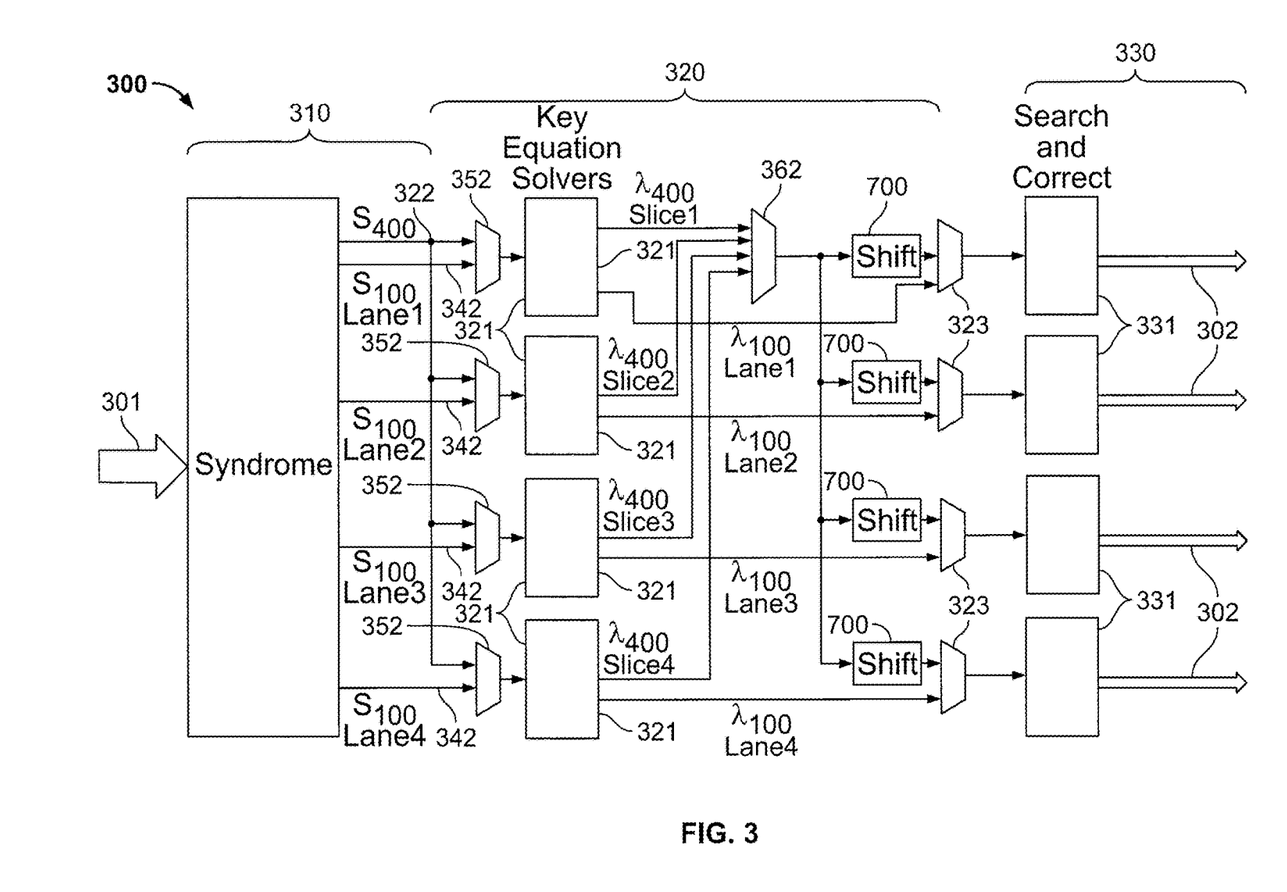
FIG. 3 shows a schematic representation of a generalized FEC decoder implemented according to the present invention.

FIG. 3 shows an overall decoder architecture 300 according to embodiments of the present invention in which one incoming lane 301 is decomposed into four outgoing lanes 302, to allow four smaller (i.e., slower) decoders to replace one larger (i.e., faster) decoder. Architecture 300 includes a syndrome calculation stage 310, a key equation solver stage 320, and a search-and-correct stage 330.

Key equation solver stage 320 includes a number of key equation solver blocks 321 which compute the error-locator polynomials λ and the error-correction polynomials Ω. Key equation solver blocks 321 may be conventional. Moreover, although the number of key equation solver blocks 321 illustrated in the drawing is equal to the number of output lanes 302, the number of key equation solver blocks 321 may differ from the number of output lanes 302, depending on the throughput of key equation solver blocks 321.

For example, if key equation solver blocks 321 are twice as fast as necessary for a one-to-one correspondence between the number of key equation solver blocks 321 and the number of output lanes 302, the number of key equation solver blocks 321 can be half the number of output lanes 320, as long as suitable buffering (not shown) is provided. Conversely, as another example, if key equation solver blocks 321 are only half as fast as necessary for a one-to-one correspondence between the number of key equation solver blocks 321 and the number of output lanes 320, the number of key equation solver blocks 321 may need to be twice the number of output lanes 320.

Syndrome calculation stage 310 may include a parallel syndrome calculation circuit, such as that disclosed in commonly-assigned U.S. Pat. No. 8,347,192, which is hereby incorporated by reference herein in its entirety. That circuit multiplies the incoming symbols by increasing powers of α, to provide terms which are then summed.

In accordance with embodiments of the present invention, the summing may be implemented as a two-stage process. The first stage sums the terms into a number of subgroups, corresponding to the number of lanes into which the decoder is to be decomposed. That number will vary from decoder to decoder, so that any particular implementation will have to provide a number of subgroups equal to the maximum number of independent lanes into which the decoder can be decomposed. The subgroups may be used individually for the individual lanes, or may be summed if the decoder is not being decomposed.

Figure 4:
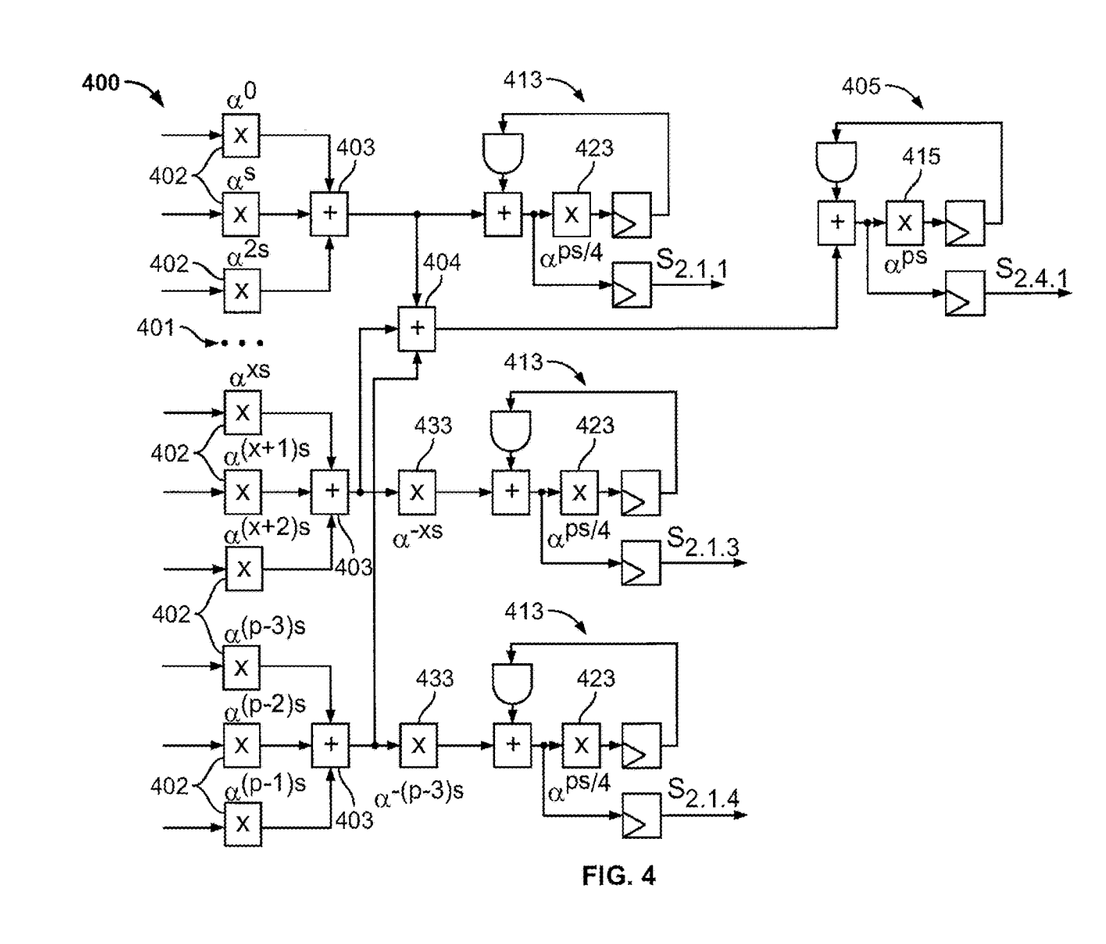
FIG. 4 is a schematic representation of one implementation for calculating syndromes according to embodiments of the present invention.

One implementation 400 for calculating syndromes is shown in FIG. 4. There will be as many instances of circuitry 400 in the decoder as the largest number of syndromes that may be encountered, which is determined by the number of check, or parity, symbols in the codewords. Specifically, one instance of circuitry 400 will be used for each syndrome that is encountered in a particular codeword. s in circuitry 400 is the index of the particular syndrome for which that instance of circuitry 400 is being used.

As drawn, circuitry 400 shows three subgroups, but ellipsis 401 indicates additional subgroups that are not shown. For example, assume there are four subgroups and 12 symbols are input per clock cycle. Taking the third syndrome, s=2, the input coefficients for multipliers 402 will be $\alpha^0, \alpha^2, \alpha^4, \alpha^6, \alpha^8, \alpha^{10}, \alpha^{12}, \alpha^{14}, \alpha^{16}, \alpha^{18}, \alpha^{20}$, and $\alpha^{22}$. Each adder 403 adds the multiplier terms for one of the subgroups. That sum is added by adder 404 (note that if there are additional subgroups represented by ellipsis 401, they also are added at adder 404) for the single lane case. The single lane sum 404 is accumulated at accumulator 405 with the running total of the syndrome, scaled at 415 by a shift value which is α raised to the product of the parallelism p and the syndrome index s. In this example where p=12 (there are 12 parallel input symbols per clock) and s=2, the shift value is $\alpha^{24}$. The result is the $s^{th}$ syndrome for the higher-speed lane, denoted $S_{s.n.1}$, where "1" indicates the lane number (only one lane in the higher-speed case) and n is the speed multiple (which is the same as the lane multiple). In our example, where s=2 and there are four lanes and the higher-speed lane is four times the speed of the lower-speed lanes, the designation is $S_{2.4.1}$.

For the subgroups, the outputs of the respective adders 403 are accumulated at respective accumulators 413, scaled at 423 by a shift value which is α raised to the product of the subgroup parallelism p/n (where n is the number of subgroups) and the syndrome index s. Thus, for four subgroups, the shift value is $\alpha^{(p/4)s}=\alpha^{ps/4}$. Except for the first subgroup, the terms must be divided back down so that each starts with $\alpha^0$, therefore at each accumulator 413 except the first one, multiplier 433 multiplies the sum, before accumulation, by the appropriate inverse syndrome power $\alpha^{-xs}, \ldots, \alpha^{-(p-3)s}$. The result is a respective $s^{th}$ syndrome for each of the lower-speed lanes, denoted $S_{s.1.m}$, where "1" (one-$n^{th}$ of n) indicates the lower lane speed and m is the lane number. In our example, s=2 and m=1, . . . , 4, and the syndromes are denoted $S_{2.1.1}$, $S_{2.1.2}$ (not shown), $S_{2.1.2}$ and $S_{2.1.4}$.

Any number of subgroups can be decomposed this way. As a further example, if the input were 64 symbols wide, one could implement one lane, four lanes (four subgroups that are sixteen symbols wide), eight lanes (eight subgroups that are eight symbols wide), sixteen lanes (sixteen subgroups that are four symbols wide), and 32 lanes (32 subgroups that are two symbols wide). Other combinations or decompositions can also be created. In this case, the subgroup additions can be nested.

Figure 5:
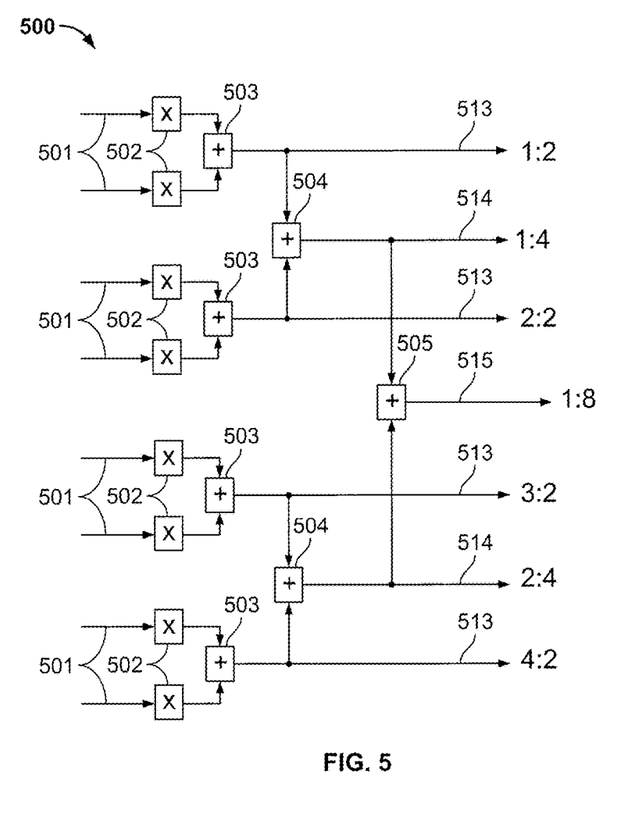
FIG. 5 is a schematic representation of a first summing arrangement.

For illustrative purposes, a simple summing arrangement 500, which may be referred to as "nested," using an eight-symbol-wide input, is shown in FIG. 5. Each symbol 501 is input to a multiplier 502. Respective pairs of multipliers 502 are added by first-level adders 503, the outputs of which can provide two-symbol-wide outputs 513. The outputs of first-level adders 503 also can be added by second-level adders 504 to provide four-symbol-wide outputs 514. The outputs of second-level adders 504 also can be added by third-level adder 505 to provide eight-symbol-wide output 515. The outputs are labelled by the notation index_of_a_certain_group_size:group_size so that, e.g., 2:4 indicates the second group having a group size of four.

Figure 6:
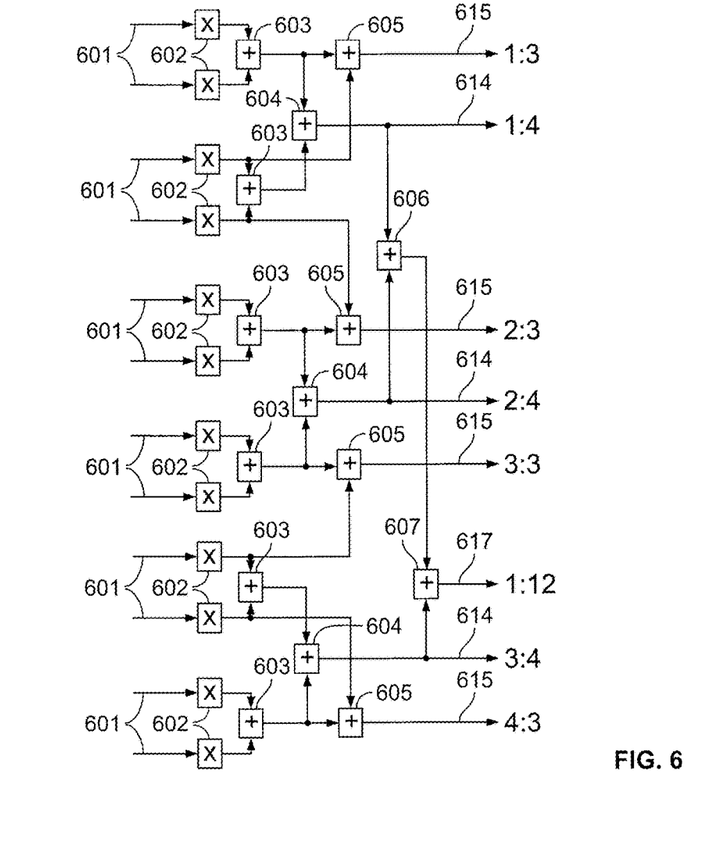
FIG. 6 is a schematic representation of a second summing arrangement.

In some cases, a recursive nesting arrangement such as the arrangement of FIG. 5 cannot be used, and fully independent or partially independent additions are used instead. FIG. 6 a case of twelve symbol inputs, with groups that are three, four, and twelve symbols wide. Once again, each symbol 601 is input to a multiplier 602. Respective pairs of multipliers 602 are added by first-level adders 603. As should be apparent, these adders can supply groups that are two symbols wide (not shown) if needed, in addition to the indicated groups that are three, four, and twelve symbols wide. Outputs of respective pairs of first-level adders 603 are then added at respective ones of second-level adders 604 to provide respective groups 614 that are four symbols wide. The output of every other one of first-level adders 603 also is added at one of third-level adders 605 to an output of one of multipliers 602 to provide a group 615 that is three symbols wide. Outputs of two of the second-level adders 604 are added to each other at fourth-level adder 606, and then the output of fourth-level adder 606 is added at fifth-level adder 607 to the output of one of second-level adders 604 to provide a group 617 that is twelve symbols wide.

The number of key equation solver blocks 321 will depend on the number of cycles required to solve the polynomials. As noted above, the aggregate throughput of the key equation solvers 321 in the key equation solver section 320 should be equal to or greater than the throughput of the lane with the largest number of check symbols. In our example, there is one 400 Gbps syndrome set 322, and four 100 Gbps syndrome sets 342. The 400 Gbps syndrome set 322 is distributed to each of the key equation solver blocks 321 in a round robin fashion via multiplexers 352. Each of the 100 Gbps syndrome sets 342 is sent to only one (in this embodiment always the same one) of the key equation solver blocks 321. The multiplexing pattern for mapping the syndrome sets to the key equation solver blocks 321 will be different for different implementations, but can be calculated by one of ordinary skill in the art.

Similarly, the output polynomials of key equation solver blocks 321 must be distributed to the search-and-correct blocks 331. As noted above, each key equation solver block 321 outputs both an error-locator polynomial λ and an error-correcting polynomial Ω. However, to avoid cluttering the drawing, only the error-locator polynomials λ are shown in FIG. 3. The circuitry is repeated (not shown) for each $\Omega_m$. For the n lower-speed lanes, as in the case of the syndrome sets each of the polynomials ($\lambda_{100\_lanen}$) is sent to only one (in this embodiment always the same one) of the search-and-correct blocks 331. For the one higher-speed lane, each respective key equation solver block 321 outputs a respective polynomial slice ($\lambda_{400\_slicen}$), and those slices are multiplexed at 362 and distributed to search-and-correct blocks 331 via shifting circuits 700 and multiplexers 323. Multiplexers 323 select for each search-and-correct block 331 either a respective polynomial slice ($\lambda_{400\_slicen}$) for the single higher-speed lane case, or a polynomial ($\lambda_{100\_lanen}$) for the multiple lower-speed lane case. For the single higher-speed lane case, the mapping again will be different for different implementations, but can be calculated by one of ordinary skill in the art.

Figure 7:
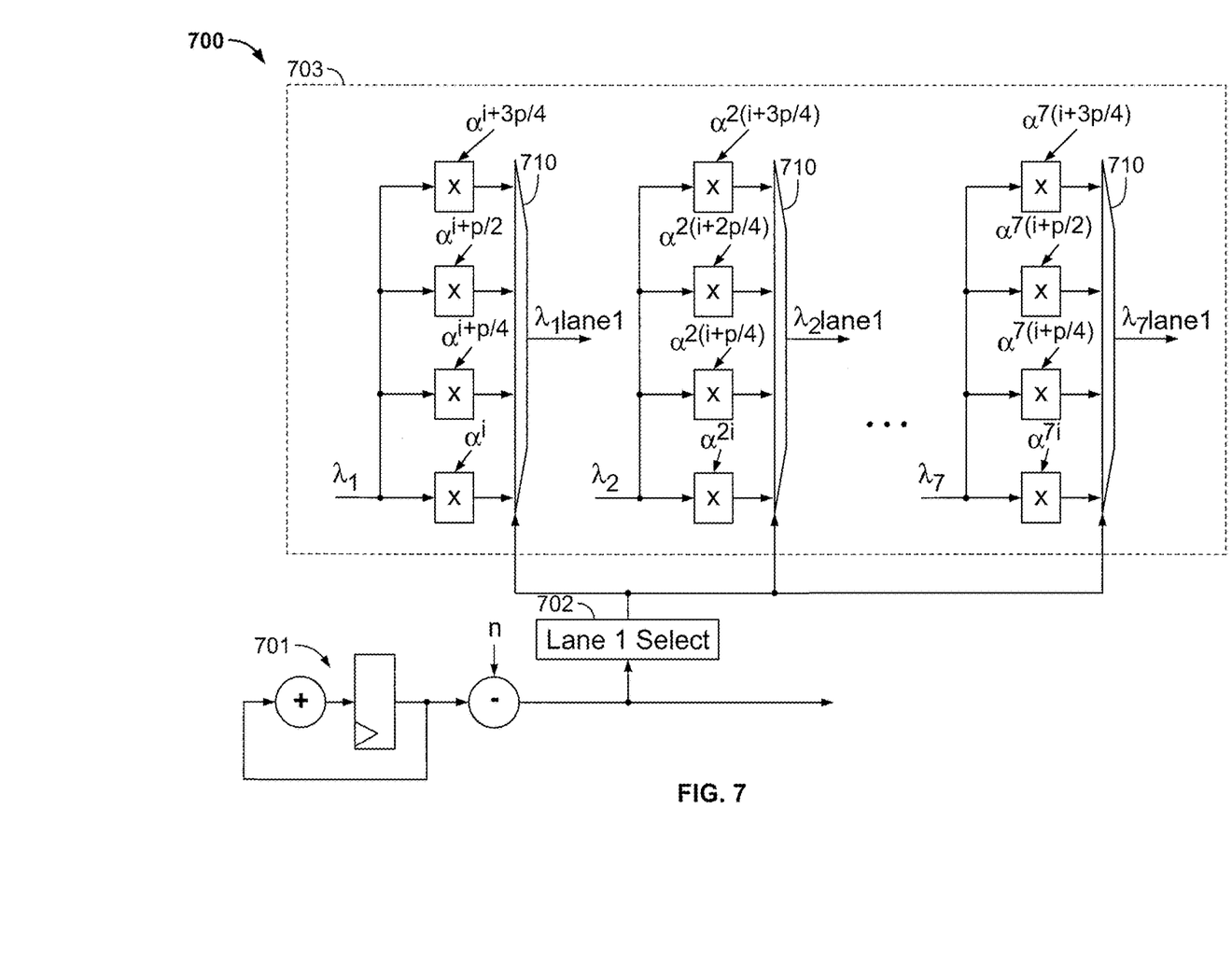
FIG. 7 is a schematic representation of a shifting circuit according to an embodiment of the present invention for accounting for codeword boundary locations.

Shifting circuit 700 is used to align each polynomial to the correct start position, depending on which of the various search-and-correct blocks 331 receives the polynomial. In the 4:1 example used above, for the multiple lower-speed lane case, there is one search-and-correct circuit per lane, with a constant mapping, so no shifting is required. But for the higher speed single-lane case, one of four of the search-and-correct blocks 331 will be used for the start of the codeword, and each quarter of the width of the codeword will be mapped to the next block 331, modulo the number of blocks 331.

In addition, in most cases, the codeword will be shortened - - - i.e., it will have fewer symbols than the maximum number supported by the field size. This will require that the polynomials be shifted to the start of the first search location before use. For the first search polynomial coefficient, this will be a $\alpha^i$. For the second, third, and subsequent coefficients it will be $\alpha^{2i}$, $\alpha^{3i}$, $\alpha^{4i}$, and so on. Because the search-and-correct circuitry is p parallel, and there are four possible start/end positions (see upper portion of FIG. 2), the input to each circuit must be further shifted by p/4 for each circuit relative to the previous circuit. For the n$^{th}$ coefficient, input to the q$^{th}$ circuit, with a total of p parallel symbols distributed over g groups, the shift value will be $\alpha^{n(i+(q-1)p/g)}$.

An implementation of shifting circuit 700 is shown in FIG. 7. Each coefficient will have one of g values to choose from. These can be selected by a multiplexer. The multiplexer selection is straightforward. As shown in FIG. 7, for each codeword type, a counter 701 counts up by the number of symbols input per lane for that codeword, modulo the codeword length n. The result will have a small number of values, which can be decoded by lane select circuit 702 to generate the multiplexer selection.

Figure 8:
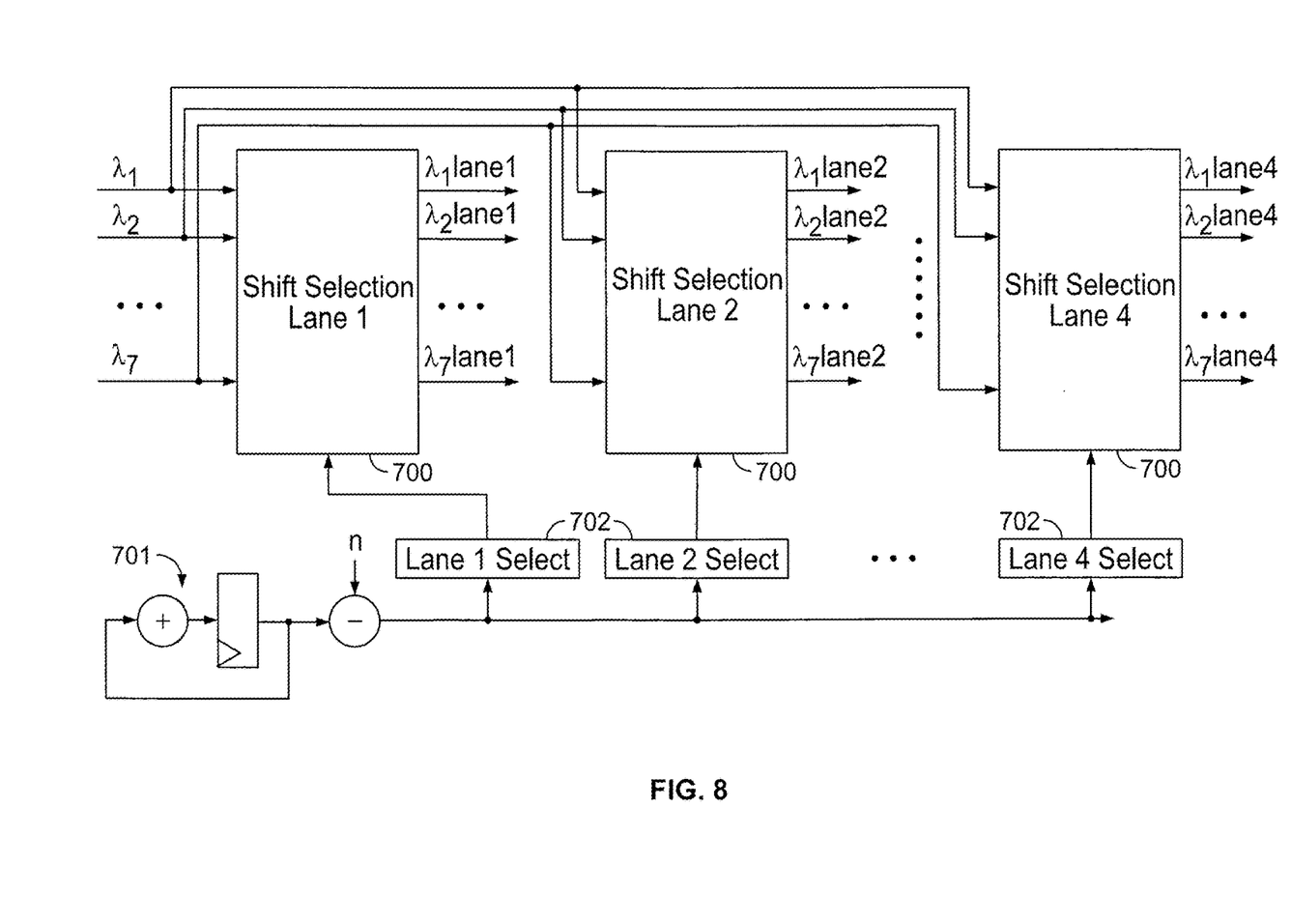
FIG. 8 shows a first arrangement of multiple shifting circuits corresponding to multiple lanes.

There is one shift select circuit 703 per lane. Shift select circuit 703 includes m 4-input multiplexers 710, one for each of m polynomials $\lambda_m$. The circuitry is repeated (not shown) for each $\Omega_m$. The selection control signal 702 will select the same input for each of multiplexers 710, shifted by the same multiple (0, 1, 2, 3) of p/4. FIG. 8 shows how a separate circuit 700 is provided for each lane, with the multiplexer selection for all lanes generated by the same counter 701. However, the lane select circuits 702 generating the selection control signals will differ to accommodate the different mappings for the different lanes.

Figure 9:
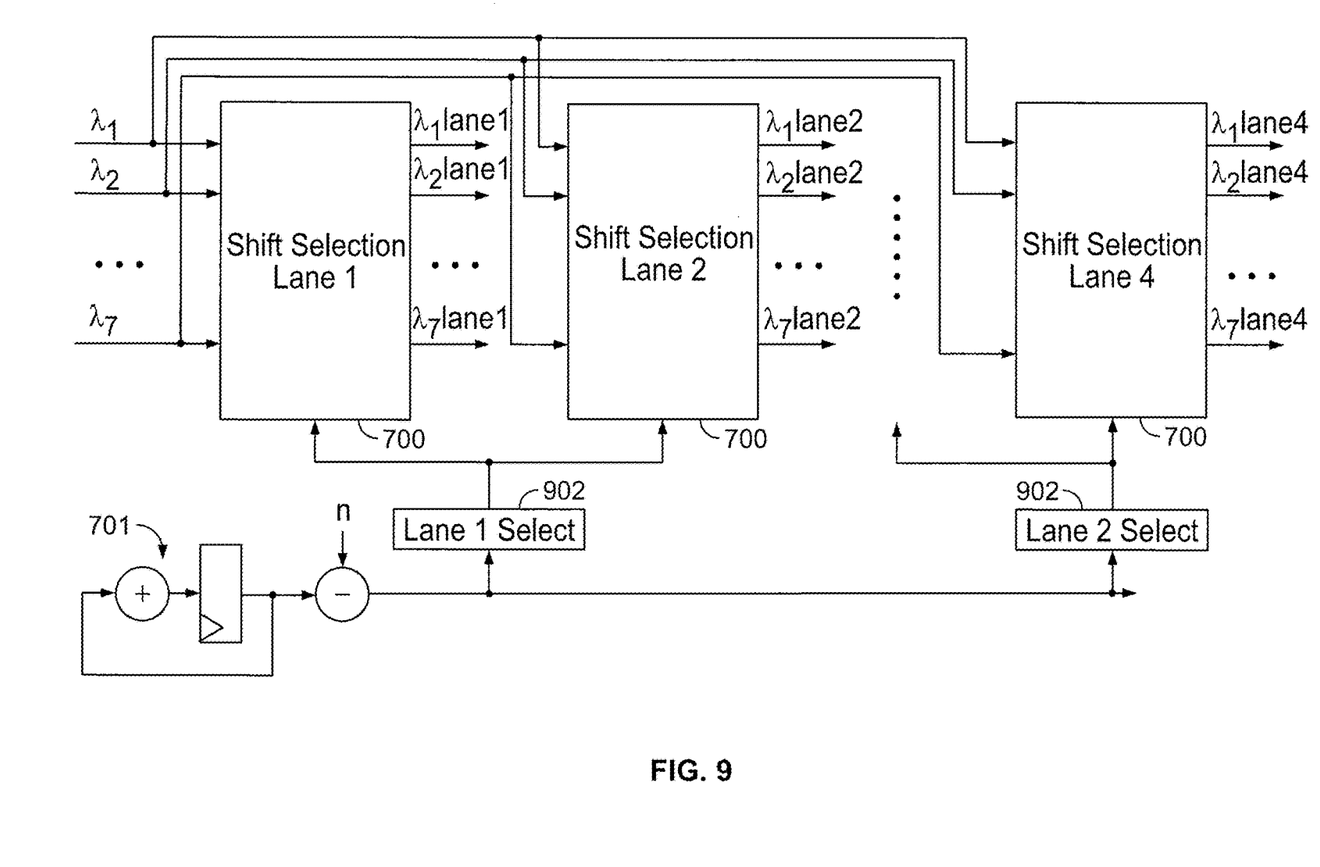
FIG. 9 shows a second arrangement of multiple shifting circuits corresponding to multiple lanes.

In some cases, the number of start/end positions is less than the number of lanes. For example, the bottom pattern in FIG. 2 only has two distinct possibilities, but nevertheless requires four lanes because of the ratio between the faster and slower speed codewords. In such a case, illustrated in FIG. 9, the selection control circuitry 902 can be shared between two lane shift selection blocks, although the mapping of the inputs to the respective ones of multiplexers 710 in the two lanes that share a selection control circuit or lane-select circuit 902 will be different.

Each of search-and-correct blocks 331 may carry out a search, such as a Chien search, by any known method. For example, a method for initializing multiple Chien search groups for a varying codeword start positions is shown in commonly-assigned U.S. Pat. No. 8,621,331, which is hereby incorporated by reference herein in its entirety. In a Reed-Solomon decoder, search-and-correct block 331 also will contain a Forney algorithm to calculate the correction values, as is well known.

Circuitry as described above may be implemented in a fixed circuit such as an ASIC, whereas in a programmable logic device (PLD) such as an FPGA, each user instantiation can be tailored to a specific need. Nevertheless, such circuitry could be provided as a hard logic block on an FPGA or other PLD. An integrated circuit device such as a PLD 140 configured to include circuitry according to an implementation of the present invention may be used in many kinds of electronic devices. One possible use is in an exemplary data processing system 1400 shown in FIG. 10. Data processing system 1400 may include one or more of the following components: a processor 1401; memory 1402; I/O circuitry 1403; and peripheral devices 1404. These components are coupled together by a system bus 1405 and are populated on a circuit board 1406 which is contained in an end-user system 1407.

Figure 10:
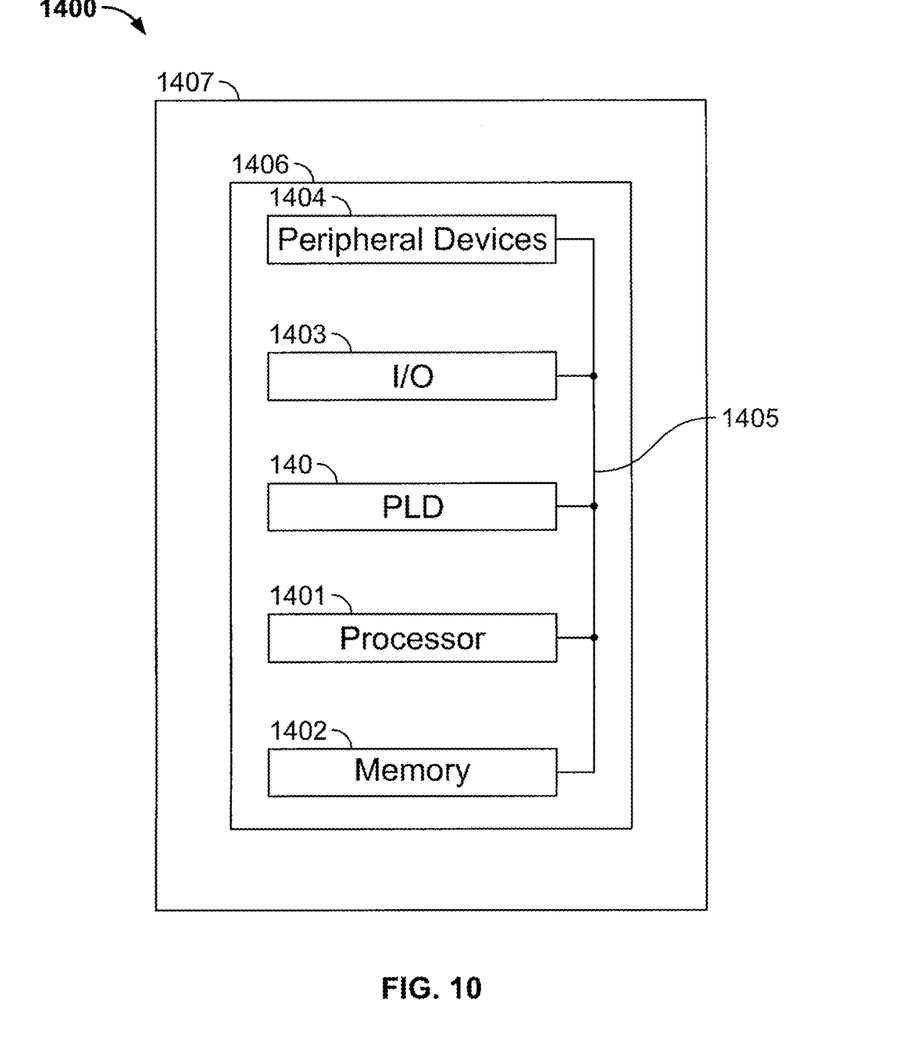
FIG. 10 is a simplified block diagram of an exemplary system employing a programmable logic device configured according to the present invention.

System 1400 can be used in a wide variety of applications, such as computer networking, data networking, instrumentation, video processing, digital signal processing, Remote Radio Head (RRH), or any other application where the advantage of using programmable or reprogrammable logic is desirable. PLD 140 can be used to perform a variety of different logic functions. For example, PLD 140 can be configured as a processor or controller that works in cooperation with processor 1401. PLD 140 may also be used as an arbiter for arbitrating access to a shared resources in system 1400. In yet another example, PLD 140 can be configured as an interface between processor 1401 and one of the other components in system 1400. It should be noted that system 1400 is only exemplary, and that the true scope and spirit of the invention should be indicated by the following claims.

Various technologies can be used to implement PLDs 140 as described above and incorporating this invention.

Figure 11:
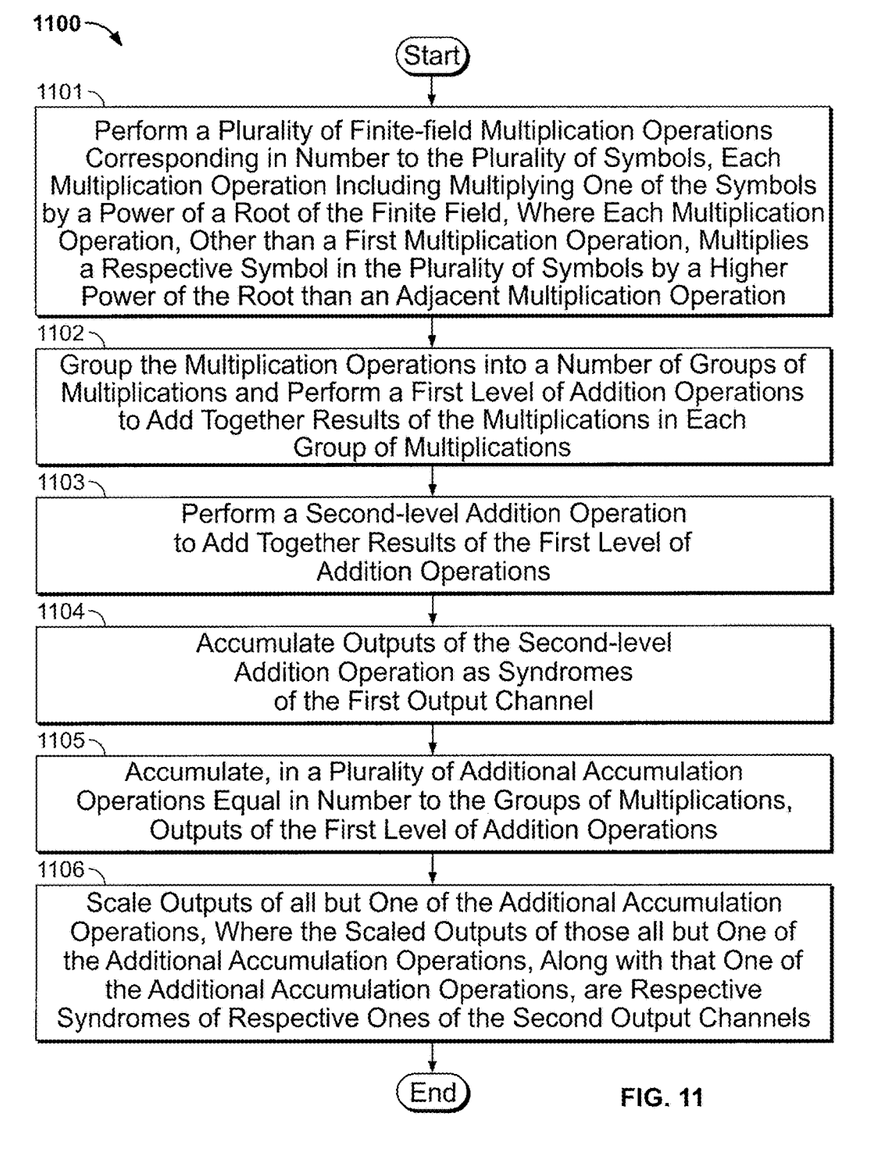
FIG. 11 is a flow diagram of a syndrome-calculating portion of a method according to the present invention.

A syndrome-calculating portion 1100 of a method to an embodiment of the invention is diagramed in FIG. 11. At 1101, a plurality of finite-field multiplication operations, corresponding in number to the plurality of symbols, are performed, with each multiplication operation including multiplying one of the symbols by a power of a root of the finite field, where each multiplication operation, other than a first multiplication operation, multiplies a respective symbol in the plurality of symbols by a higher power of the root than an adjacent multiplication operation. At 1102, the multiplication operations are grouped into a number of groups of multiplications, and a first level of addition operations is performed to add together results of the multiplications in each group of multiplications. At 1103, a second-level addition operation is performed to add together results of the first level of addition operations. At 1104, outputs of the second-level addition operation are accumulated as syndromes of the first output channel. At 1105, in a plurality of additional accumulation operations equal in number to the groups of multiplications, outputs of the first level of addition operations are accumulated. At 1106, outputs of all but one of the additional accumulation operations are scaled, where the scaled outputs of those all but one of the additional accumulation operations, along with that one of the additional accumulation operations, are respective syndromes of respective ones of the second output channels.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. Decoder circuitry for an input channel having a first data rate, a codeword on said input channel including a plurality of symbols, wherein:

said decoder circuitry includes both an option to provide a first output channel having said first data rate and an option to provide a plurality of second output channels parallel to said first output channel and having second data rates less than said first data rate;

said decoder circuitry comprises syndrome calculation circuitry, polynomial calculation circuitry, and search-and-correct circuitry; and said syndrome calculation circuitry comprises:

a plurality of finite-field multipliers corresponding in number to said plurality of symbols for multiplying said symbols by a power of a root of said finite-field, each respective multiplier in said plurality of finite-field multipliers, other than a first multiplier, multiplying a respective symbol in said plurality of symbols by a higher power of said root than an adjacent multiplier in said plurality of finite-field multipliers, first-level adder circuitry for adding outputs of a number of groups of multipliers in said plurality of finite-field multipliers,
a second-level adder for adding outputs of said first-level adder circuitry,
a first accumulator for accumulating outputs of said second-level adder as syndromes of said first output channel having said first data rate,
a plurality of second accumulators equal in number to said groups of multipliers for accumulating outputs of said first-level adder circuitry, and
a respective scaling multiplier for all but one of said second accumulators, whereby an output of each of said second accumulators is a syndrome of one of said second output channels having said second data rates less than said first data rate.

2. The decoder circuitry of claim 1 comprising a respective instance of said syndrome calculation circuitry for each syndrome of said codeword; wherein:
each respective one of said plurality of finite-field multipliers multiplies a respective one of said symbols by said root raised to a product of an index related to said one of said symbols and an index of said syndrome.

3. The decoder circuitry of claim 2 wherein said respective scaling multiplier factors out, prior to a respective one of said second accumulators, a smallest output of one of said plurality of finite-field multipliers that contributes to said respective one of said second accumulators.

4. The decoder circuitry of claim 1 wherein said first accumulator applies a first scaling factor equal to said root raised to a product of a total number of said symbols and an index of said syndrome.

5. The decoder circuitry of claim 4 wherein each of said second accumulators applies a second scaling factor equal to said first scaling factor divided by said number of groups of multipliers.

6. The decoder circuitry of claim 1 wherein said plurality of finite-field multipliers are divided evenly into said groups of multipliers.

7. The decoder circuitry of claim 1 wherein said plurality of finite-field multipliers are divided unevenly into said groups of multipliers.

8. The decoder circuitry of claim 1 wherein said search-and-correct circuitry comprises a plurality of search-and-correct circuits equal in number to said plurality of second output channels; said decoder circuitry further comprising:
mapping circuitry to conduct outputs of said polynomial calculation circuitry to said search-and-correct circuitry, said mapping circuitry comprising shifting circuitry to compensate for codeword boundaries that vary in location relative to clock cycle boundaries.

9. The decoder circuitry of claim 8 wherein said shifting circuitry comprises:
a respective shift selection circuit for each of said search-and-correct circuits;
a modulo-codeword-length counter to generate a shift control signal for the respective shift selection circuits; and a plurality of shift-select decoders for decoding said shift control signal to control said search- and correct circuits.

10. The decoder circuitry of claim 9 wherein said plurality of shift-select decoders is equal in number to said plurality of search-and-correct circuits.

11. The decoder circuitry of claim 9 wherein, when codeword boundaries at locations other than clock boundaries are fewer in number than said plurality of search-and-correct circuits, said plurality of shift-select decoders is less in number than said plurality of search-and-correct circuits, at least one of said plurality of shift-select decoders being shared by more than one shift selection circuit.

12. The decoder circuitry of claim 11 wherein each of said shift-select decoders is by two of said shift selection circuits.

13. A method of decoding, via decoder circuitry, an input channel having a first data rate, a codeword on said input channel including a plurality of symbols, wherein:
said decoding method includes both an option to provide a first output channel having said first data rate and an option to provide a plurality of second output channels parallel to said first output channel and having second data rates less than said first data rate;
said decoding method comprises calculating syndromes via syndrome calculation circuitry of said decoder circuitry, calculating polynomials via polynomial calculation circuitry of said decoder circuitry, and performing search-and-correct operations via search-and-correct circuitry of said decoder circuitry;
said calculating syndromes comprises:
performing a plurality of finite-field multiplication operations via a plurality of finite-field multipliers corresponding in number to said plurality of symbols, each multiplication operation including multiplying one of said symbols by a power of a root of said finite-field, each multiplication operation, other than a first multiplication operation, multiplying a respective symbol in said plurality of symbols by a higher power of said root than an adjacent multiplication operation,
grouping said multiplication operations into a number of groups of multiplications and performing a first level of addition operations via first-level adder circuitry to add together results of the multiplications in each group of multiplications,
performing a second-level addition operation via a second-level adder to add together results of said first level of addition operations,
accumulating via a first accumulator, in a first accumulation operation, outputs of said second-level addition operation as syndromes of said first output channel having said first rate,
accumulating via a plurality of second accumulators, in a plurality of additional accumulation operations equal in number to said groups of multiplications, outputs of said first level of addition operations, and
scaling via a respective scaling multiplier outputs of all but one of said additional accumulation operations; and said scaled outputs of said all but one of said additional accumulation operations, along with said one of said additional accumulation operations, are respective syndromes of respective ones of said second output channels having said second data rates less than said first data rate.

14. The decoding method of claim 13 wherein each respective one of said plurality of finite-field multiplication operations multiplies a respective one of said symbols by said root raised to a product of an index related to said one of said symbols and an index of said syndrome.

15. The decoding method of claim 14 wherein said scaling comprises factoring out, prior to a respective one of said additional accumulation operations, a smallest output of one of said plurality of finite-field multiplication operations that contributes to said respective one of said additional accumulation operations.

16. The decoding method of claim 13 wherein said first accumulation operation applies a first scaling factor equal to said root raised to a product of a total number of said symbols and an index of said syndrome.

17. The decoding method of claim 16 wherein each of said additional accumulation operations applies a second scaling factor equal to said first scaling factor divided by said number of groups of multiplications.

18. The decoding method of claim 13 wherein said plurality of multiplication operations are divided evenly into said groups of multiplication operations.

19. The decoding method of claim 13 wherein said plurality of multiplication operations are divided unevenly into said groups of multiplication operations.

20. The decoding method of claim 13 wherein said performing search-and-correct operations comprises performing a plurality of search-and-correct operations equal in number to said plurality of second channels; said decoding method further comprising:
  mapping outputs of said polynomial calculation operations to said search-and-correct operations, said mapping comprising shifting to compensate for codeword boundaries that vary in location relative to clock cycle boundaries.

21. The decoding method of claim 20 wherein said shifting comprises:
  generating a shift control signal from a modulo-codeword-length counter operation; and
  decoding said shift control signal to control said search-and correct operations.

* * * * *